(12) United States Patent
DeBrita et al.

(10) Patent No.: US 7,256,647 B2
(45) Date of Patent: Aug. 14, 2007

(54) METHOD AND APPARATUS FOR PRESETTING AN AMPLIFIER

(75) Inventors: Albert A. DeBrita, Jericho, VT (US); Michael J. Lencioni, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 11/162,098

(22) Filed: Aug. 29, 2005

(65) Prior Publication Data
US 2007/0046367 A1    Mar. 1, 2007

(51) Int. Cl.
*H03F 3/04* (2006.01)
(52) U.S. Cl. .......................... 330/2; 714/727
(58) Field of Classification Search ............ 330/2, 330/252; 714/726–727
See application file for complete search history.

(56) References Cited

U.S. PATENT DOCUMENTS

| | | | |
|---|---|---|---|
| 2005/0060624 A1* | 3/2005 | Moore et al. | 714/727 |
| 2005/0190828 A1* | 9/2005 | Hsu et al. | 375/224 |

OTHER PUBLICATIONS

Eklow, Bill et al., "IEEE 1149.6—A Practical Perspective," IEEE ITC International Test Conference, Paper 19.1, 0-7803-8106-8/03, pp. 494-502

* cited by examiner

*Primary Examiner*—Robert Pascal
*Assistant Examiner*—Hieu Nguyen
(74) *Attorney, Agent, or Firm*—W. R. Harding; Anthony V. S. England (57) ABSTRACT

An output of a common mode differential amplifier is initialized to a known state, which includes inputting a voltage to a network conductor of an electronic assembly, where the network conductor is coupled to a first input node of a first differential input of the amplifier. The amplifier is on an integrated circuit chip of the assembly and has a self-bias node. Circuitry of the amplifier normally adjusts to obtain an equilibrium voltage on the self-bias node in response to the inputted voltages. To initialize the amplifier output, however, preset circuitry on the integrated circuit chip overrides the normal equilibrium voltage on the self-bias node, forcing the self-bias node to a predetermined voltage regardless of the amplifier input voltages. In response, the amplifier produces an desired initial output state on a first output node of the amplifier.

20 Claims, 6 Drawing Sheets

METHOD AND APPARATUS FOR PRESETTING AN AMPLIFIER

BACKGROUND

1. Field of the Invention

The present invention concerns testing of electronic assemblies, and, more particularly, concerns testing of network communication by differential receivers and drivers to detect faults on electronic assemblies.

2. Related Art

IEEE standard 1149.6, Standard for Boundary Scan testing of Advanced Digital Networks, 2003, which is hereby incorporated herein by reference, specifies a way of finding faults at a high level of assembly on production lines, i.e., at a level above that of a chip or a module, such as at the printed circuit board assembly level. In particular, and referring to FIG. 1, a driver 103 and receiver 104 is shown on an assembly 100, which may be a printed circuit board or the like. Driver 103 and receiver 104 are referred to by the IEEE 1149.6 standard as a "mission" driver and "mission" receiver. Mission driver 103 and receiver 104 on assembly 100 are connected to a communication network 102 during production.

Figure 1:
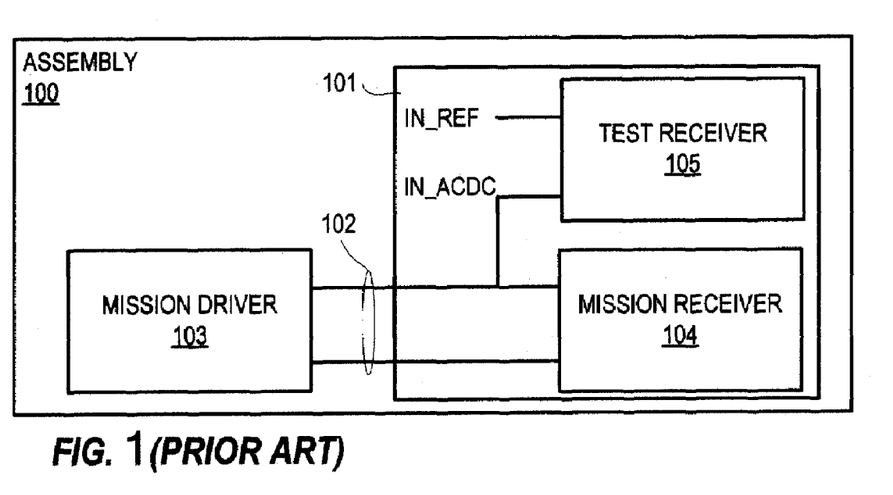
FIG. 1 illustrates an assembly under test, according to the prior art.

Previously, it has been conventional during assembly testing to use what is now called mission receiver 104 to detect faults on the assembly 100 portion of a communication network 102 to which receiver 104 is connected. However, because they are designed to communicate in a fault tolerant manner, the network 102 to which mission driver 103 and receiver 104 are connected may have a fault they do not detect, such as a high impedance due to a poor solder connection.

To address this problem, IEEE 1149.6 specifies certain assembly-related testing. (Because it's function is referred to merely as that of a "receiver" in the language of IEEE 1149.6, receiver 105 might be confused with mission receiver 104. Mission receiver 104 detects information on a pair of network conductors 102, and is independent of the other, fault-detection-related, so-called "receiver" 105. The fault-detection-related receiver 105 will herein be referred to as a "test receiver" 105.) Unlike a mission receiver, the IEEE 1149.6 test receiver is not intended to be fault tolerant. Quite the contrary, since it is solely for fault detection, test receiver 105 is intended to be fault intolerant. According to IEEE 1149.6, mission receiver 104 includes a differential receiver (not shown in FIG. 1) connected to a pair of network conductors 102. Test receiver 105 and mission receiver 104 are on the same chip 101. Mission driver 103 and at least part of network 102 are off of chip 101.

Figure 2:
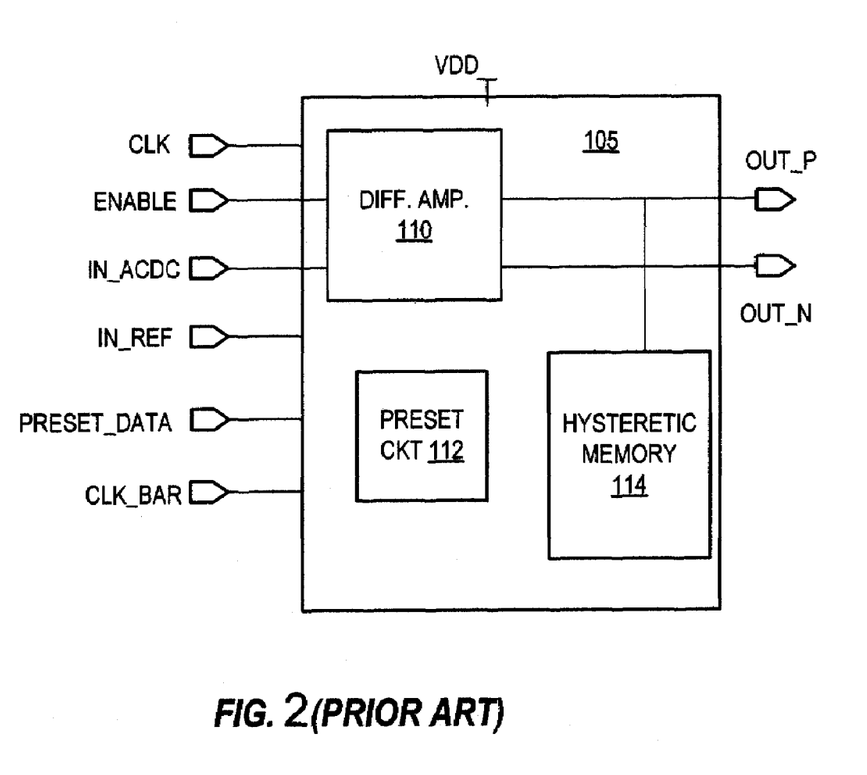
FIG. 2 illustrates a generally specified test receiver, according to the prior art.

Referring now to FIG. 2, test receiver 105 includes a differential amplifier 110, but with only one of its differential inputs, IN_ACDC, coupled to only one of the conductors of network pair 102 (FIG. 1) and its other differential input coupled to a reference voltage IN_REF. In this manner, differential amplifier 110 is not assisted in proper detection of a transmitted signal on one conductor by a correspondingly transmitted signal on the other conductor of network conductor pair 102.

Also unlike a mission receiver 104 (and unlike most amplifiers, in general), the differential amplifier 110 of test receiver 105 has a preset circuit 112 and a hysteretic memory 114 that relate to operation in the following manner. Before a fault detection sequence begins, the preset circuit 112 of test receiver 105 drives a short pulse to initialize differential amplifier 110 to a predetermined state. Because of hysteretic memory 114, differential amplifier 110 tends to retain its initialized state even after its pre-set-circuit-driven initialization pulse ends, unless amplifier 110 is driven to a new state by signals on its inputs. After differential amplifier 110 is preset, mission driver 103 (FIG. 1) drives a sequence of test signals on network conductors 102. Differential amplifier 110 may or may not detect these signals, depending on whether there is an assembly fault. Because differential amplifier 110 is fault intolerant, a test signal on its input IN_ACDC from one of network conductors 102 succeeds in resetting the outputs of differential amplifier 110 only if the signal is cleanly transmitted, i.e., without being impaired by even a minor assembly fault, such as a slightly imperfect connection, for example.

While IEEE 1149.6 specifies an arrangement and manner of operation of the test receiver, it does so in general terms. Thus, a needs exists for a test receiver suitable for detecting faults on electronic devices during assembly testing and that meets the general specifications of IEEE 1149.6

SUMMARY OF THE INVENTION

The foregoing need is addressed in the present invention, in which an electronic assembly has an amplifier on an integrated circuit chip of the assembly. According to one form of the invention, a method of testing includes applying a predetermined test voltage to a path of the electronic assembly. Circuitry of the amplifier is operable to produce a voltage on an output node of the amplifier and a self-bias voltage on a self-bias node of the amplifier responsive to voltages applied to differential input nodes of the amplifier. The applied test voltage is for testing conduction of the path, including conduction to one of the differential input nodes. Preset circuitry forces an initializing voltage on the self-bias node. Thus, if the amplifier tends to produce an equilibrium voltage on the self-bias node responsive to the applied test voltage, the initializing voltage overrides the equilibrium voltage. In this manner, the amplifier produces an initial voltage on the output node in response to the initializing voltage on the self-bias node and independently of the applied test voltage.

In another aspect of the invention, the preset circuitry includes a tri-state inverter having an output coupled to the self-bias node and a pulldown transistor coupled between the self-bias node and a ground source. The pulldown transistor is turned off in an amplifier enabling mode, so that the self-bias node is not grounded. The inverter is switched to an initializing mode for the overriding of the voltage on the self-bias node. In the initializing mode, the tri-state inverter produces the initializing voltage on an output of the inverter in response to a data signal applied to an input of the tri-state inverter. Then, after the initializing of the voltage on the inverter output, self-bias node and amplifier output, the inverter is switched to a non-initializing mode. In the non-initializing mode, the inverter output has a high output impedance. In this manner, after the amplifier produces the initial voltage on the output node in response to the initializing voltage on the self-bias node, the circuitry of the amplifier produces a test-response voltage on the output node of the amplifier responsive to the test voltage applied to one of the amplifier input nodes via the path.

In another aspect of the invention, a hysteretic memory is coupled to the amplifier output node, and the initializing of the amplifier output includes storing the initial voltage of the amplifier output node by the hysteretic memory as a first logic state. If conduction of the path exceeds a certain conduction threshold, the test-response voltage on the output node of the amplifier drives the hysteric memory to a second logic state.

In another aspect, the pulldown transistor is turned on responsive to an amplifier disabling state of an amplifier control signal and turned off responsive to an amplifier enabling state of the amplifier control signal.

In another aspect, the inverter is switched to the initializing mode responsive to an initializing state of an inverter control signal and to the non-initializing mode responsive to a non-initializing state of the inverter control signal.

In another aspect, the amplifier includes source circuitry isolation transistors coupled to respective voltage and ground sources and source circuitry bias transistors coupled to the respective source circuitry isolation transistors. First and second input circuitry of the amplifier have biasing transistors with conducting electrodes coupled to the voltage and ground sources through source circuitry isolation and biasing transistors and with gates coupled to the respective amplifier input nodes. The source circuitry isolation transistors are turned on in response to an enabling state of the amplifier control signal, so that the source circuitry bias transistors are conductively coupled to their respective voltage and ground sources for an enabled mode of operation of the amplifier. The source circuitry isolation transistors are turned off in response to a disabling state of the amplifier control signal, so that the source circuitry bias transistors are isolated from their respective voltage and ground sources for an disabled mode of operation of the amplifier.

In another aspect, first output circuitry of the amplifier has biasing transistors with gates coupled to the self-bias node and with conducting electrodes coupling the output node to the voltage and ground sources. Producing the initial voltage on the output node responsive to the initializing voltage on the self-bias node includes switching the first output circuitry biasing transistors in response to the forced overriding of the self-bias node voltage, in order to conductively couple the output node to only one or the other of the voltage and ground sources.

In another aspect, second output circuitry of the amplifier has biasing transistors with gates coupled to the self-bias node and with conducting electrodes coupling a second output node to the voltage and ground sources. The second output circuitry biasing transistors are switched in response to the forced overriding of the self-bias node voltage to conductively couple the second output node to only one or the other of the voltage and ground sources, so that the initial voltage of the first output node is also produced on the second output node.

For the amplifier enabling mode, the second output node is conductively coupled to the self-bias node via pass gate transistors. Each such pass gate transistor has a conducting impedance at least ten times larger than a conducting impedance of each of the second output circuitry biasing transistors.

Other variations, objects, advantages, and forms of the invention will become apparent upon reading the following detailed description and upon reference to the accompanying drawings.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF A PREFERRED EMBODIMENT OF THE INVENTION

In the following detailed description of the preferred embodiments, reference is made to the accompanying drawings illustrating embodiments in which the invention may be practiced. It should be understood that other embodiments may be utilized and changes may be made without departing from the scope of the present invention.

Test Receiver of an Embodiment of the Present Invention

Figure 3:
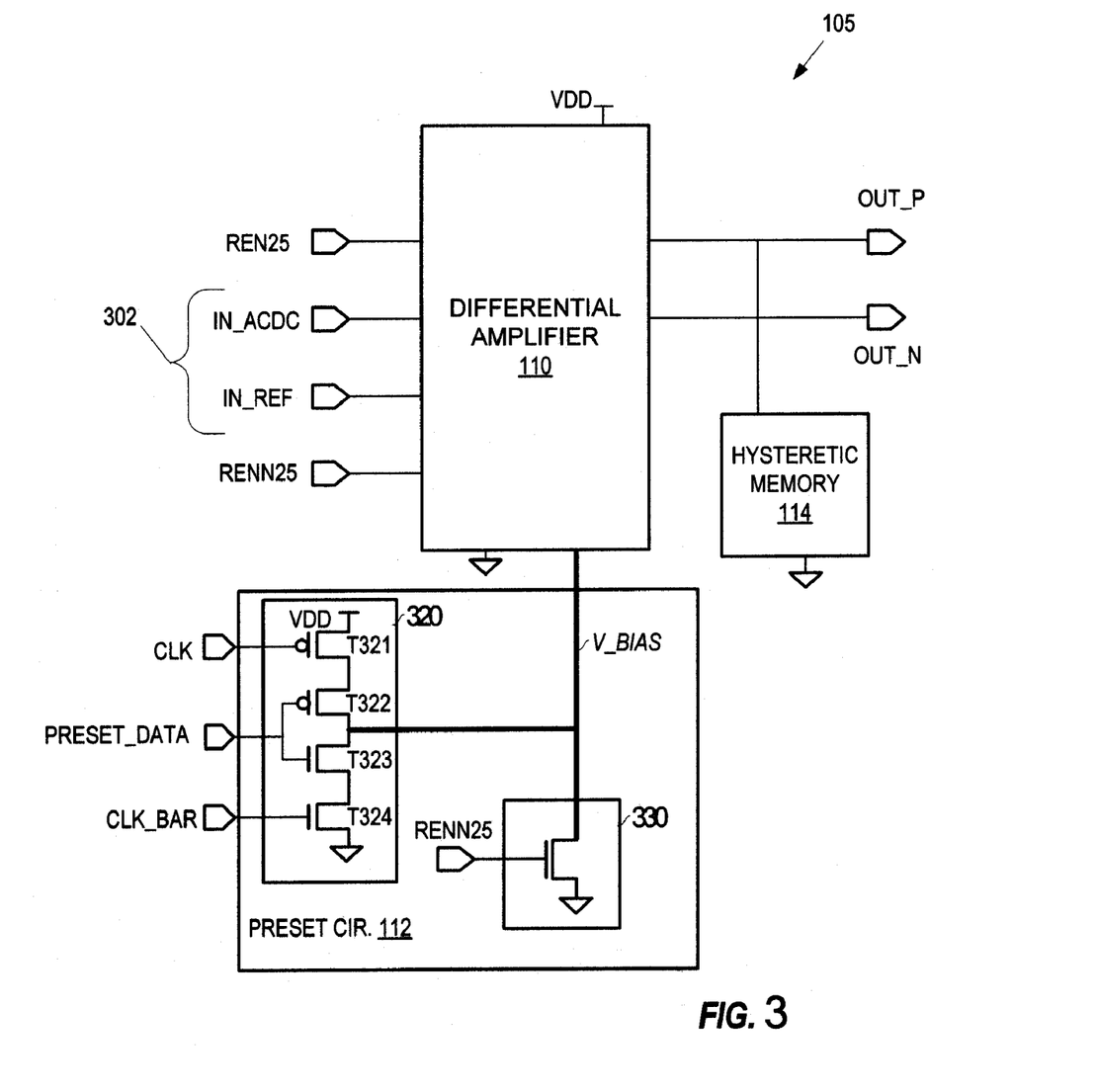
FIG. 3 illustrates a test receiver, according to an embodiment of the present invention.

Referring now to FIG. 3, a test receiver 105 is shown, according to an embodiment of the present invention. Test receiver 105 includes an analog, wide common mode, differential amplifier 110 optimized for single-ended operation. Differential amplifier 110 has positive and negative differential inputs, IN_ACDC and IN_REF, and positive and negative differential outputs, OUT_P and OUT_N. This particular kind of differential amplifier 110 has a voltage bias node, V_BIAS, which in conventional operation seeks its own equilibrium.

In similar fashion as described concerning receiver 105 herein above, it should be understood that amplifier 110 has a variety of modes of operation/nonoperation. In testing mode, amplifier 110 operates to detect data driven by mission driver 103, or else not detect the data, if there is an assembly fault. Prior to the testing mode, amplifier 110 operates in an initialization mode. Finally, since amplifier 110 is for assembly-related testing and will not be used during normal operation of the assembly, amplifier 110 is disabled before and after the initialization and testing. (The initialization and testing modes are herein also referred to collectively as an amplifier enabled mode. The testing and disabled modes may also be referred to herein as a "non-initialization" mode.) To achieve the above described initialization, testing and disabled modes of operation, according to the embodiment of the invention illustrated in FIG. 3, a tri-state inverter 320 and pulldown field effect transistor 330 ("FET") are included in test receiver 105, as shown, and isolation circuitry of amplifier 110 (not shown in FIG. 3) are also used.

The following table provides an overview of how the various elements of receiver 105 relate to these modes of operation:

TABLE ONE

|  | INITIALIZATION (enabled) | TEST (enabled) | DISABLED |
|---|---|---|---|
| Tri-State Inv. 320 | Drives VBIAS high or low and Amp. 110 outputs high, irrespective of amp. 110 inputs. | Tri-stated, i.e., output has high impedance and thereby does not influence VBIAS node. | Tri-stated, i.e., output has high impedance and thereby does not influence VBIAS node. |
| Pulldown FET 330 | Off, i.e., nonconducting. Does not influence VBIAS node. | Off, i.e., nonconducting. Does not influence VBIAS node. | On, i.e., conducting, and thereby pulls VBIAS to ground. |
| Isolation FET's in amplifier 110 (not shown in FIG. 3) | On, i.e., conducting. Does not isolate VBIAS or source FET's in amp. 110. | On, i.e., conducting. Does not isolate VBIAS or source FET's in amp. 110. | Off, i.e., nonconducting, and thereby isolates VBIAS from OUTPUT_N and source FET's from input circuitry in amp. 110. |

Tri-state inverter 320 has its output coupled to the amplifier 110 voltage bias node, V_BIAS. Inverter 320 has three inputs, CLK, CLK_BAR and PRESET_DATA. Tri-state inverter has an N-type field effect transistor ("NFET") T323 and a P-type field effect transistor ("PFET") T322, with their gates coupled together to the PRESET_DATA input and one of each of their conducting electrodes coupled together to the output, which is coupled to voltage bias node, V_BIAS. The other conducting electrode of PFET T322 is coupled to a conducting electrode of another PFET T321 that has its other conducting electrode coupled to VDD. The other conducting electrode of NFET T323 is coupled to a conducting electrode of another NFET T324 that has its other conducting electrode coupled to ground. The gate of PFET T321 is coupled to CLK and the gate of NFET T324 is coupled to CLK_BAR. For initialization, tri-state inverter 320 drives VBIAS high or low responsive to its inputs, and under the accompanying circumstances indicated in Table One above. This causes amplifier 110 to drive its outputs high, irrespective of amplifier 110 inputs. Otherwise, for testing and disabling of amplifier 110, the output of tri-state inverter 320 is fixed at a high output impedance.

Pulldown transistor 330 is included in test receiver 105 to assist isolation circuitry (not shown in FIG. 3) for disabling amplifier 110. Transistor 330 is an NFET and has one conducting electrode coupled to voltage bias node, V_BIAS, its other conducting electrode coupled to ground, and its gate coupled to an RENN25 input. As stated herein above, tri-state inverter 320 is fixed at high output impedance for disabling amplifier 110. Therefore, NFET 330 is operable to pull the output of inverter 120 and the V_BIAS node of amplifier 110 down to ground in response to assertion of the RENN25 signal on its gate.

Responsive to this grounding of V_BIAS and operation of the isolation circuitry (as will be described further herein below), amplifier 110 drives both its outputs OUT_P and OUT_N to a high voltage state.

A Presetting Problem and an Initialization Sequence

Figure 4:
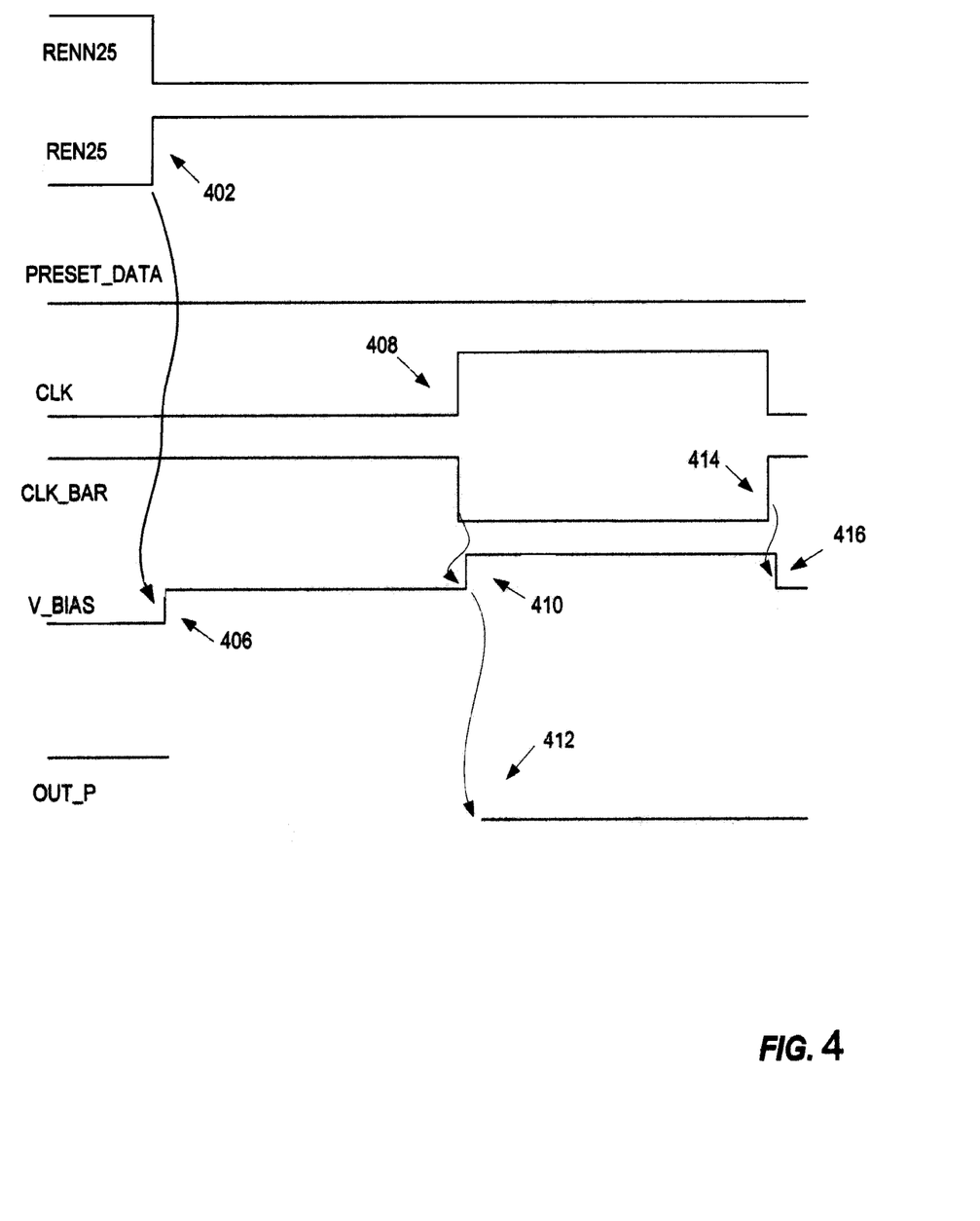
FIG. 4 illustrates signals for an initialization sequence of test receiver, according to an embodiment of the present invention.

Referring now to FIG. 4 in conjunction with FIGS. 1 through 3, an overview of an initialization sequence of differential amplifier 110 is shown, according to an embodiment of the present invention.

To prepare for detecting test data driven by mission driver 103 during assembly testing, input signals IN_ACDC and IN_REF (not shown in FIG. 4) are fixed at predetermined voltage levels defined by a fault test data stream. The predetermined voltage levels of the inputs depend on the fault test to be performed. The response of amplifier 110 outputs OUT_N and OUT_P to the input signals fixed on lines IN_A and IN_REF after the outputs have been initialized indicates whether there are significant faults on the tested portion of assembly 100.

Test receiver 105, including amplifier 110, inverter 320, pulldown transistor 330 and hysteretic memory 114, are on a single integrated circuit chip 101, according to an embodiment of the present invention. The input signals IN_ACDC and IN_REF may be sourced mission driver 103 driving the signals from the end of network conductor pair 102 remote from amplifier 110, or by applying the signals directly to inputs IN_ACDC and IN_REF on chip 101. It should be appreciated that the effect of these input signals IN_ACDC and IN_REF on amplifier 110 is not certain unless it is known that there are no significant faults on the portion of assembly 100 from at least the source of the signals to amplifier 110. This, of course, is not yet known at the beginning of a test sequence, since the purpose of amplifier 110 is to test the assembly 100.

The arrangement shown in FIG. 3 provides a solution to a presetting problem arising from this issue and that was presented in the prior art, i.e., how to preset amplifier 110 to a known state in order to test assembly 105. More particularly, the problem includes how to preset amplifier 110 without a lot of extra circuitry and without reliably known signals IN_ACDC and IN_REF at the actual input nodes of amplifier 110.

Although predetermined input signals are fixed on lines IN_ACDC and IN_REF in the initialization sequence, the inputs do not determine the initialized state of amplifier 110, i.e., the state of outputs OUT_N and OUT_P. It is for this reason that the inputs are not shown in FIG. 4. Before signal RENN25 is de-asserted at 402 in FIG. 4, OUT_P is determined by NFET 330, which is turned on. Because this pulls the V_BIAS node to ground through NFET 330, the voltage level on the V_BIAS node is independent of the amplifier's inputs IN_ACDC and IN_REF. In accordance with the arrangement of FIG. 3, signal RENN25 is de-asserted at 402 to enable operation of amplifier 110. This turns off NFET 330 so that the V_BIAS node is no longer grounded. (Signal REN25 and/or signal RENN25 may be referred to herein as an amplifier control signal having an amplifier enabling state, i.e., REN25 de-asserted and/or RENN25 asserted, and an amplifier disabling state, i.e., REN25 asserted and/or RENN25 de-asserted.) Also at 402, signal REN25 is asserted. This conductively couples output OUT_N to the V_BIAS node, as will be further explained herein below. The V_BIAS node of amplifier 110 responsively finds an equilibrium voltage level at about V$_{DD}$/2, as shown at 406 and as will also be further explained. In the region between events 406 and 412 in FIG. 4, OUT_P is not shown because V_BIAS is not being forced and the effect of IN_ACDC and IN_REF is not known.

Throughout the presetting sequence shown in FIG. 4, a low voltage PRESET_DATA signal is applied to inverter 320, as shown. This is because in the particular instance illustrated it is desired that OUT_P should be preset to a low state and because a high voltage level out of inverter 320 will force OUT_P low, as will be further explained in connection with FIG. 5. The PRESET_DATA signal does not determine the output of inverter 320, however, until a high CLK signal and its complement signal, CLK_BAR, are applied at 408 to inverter 320. In response to these three signals, the output of inverter 320 (and the connected V_BIAS node of amplifier 110) drives to a high voltage state at 410, i.e., the inverse of the low state of the applied PRESET_DATA signal. This, in turn, at 412, causes amplifier 110 to generate a low voltage state at its output OUT_P, i.e., the amplifier 110 output is forced, independently of the input voltages to amplifier 110.

At 414, CLK signal goes low and its complement signal, CLK_BAR, goes high. (Signal CLK and/or signal CLK_BAR may be referred to herein as a preset circuitry control signal or inverter control signal having an initialization or initializing state, i.e., CLK de-asserted and/or CLK_BAR asserted, and a non-initialization or non-initializing state, i.e., CLK asserted and/or CLK_BAR de-asserted.) In response, the output of inverter 320 is again tri-stated, permitting the V_BIAS node of amplifier 110 to once again responsively find an equilibrium voltage level at about V$_{DD}$/2, as shown at 416. Thus, it should be understood that in the region between events 412 and 416 in FIG. 4, OUT_P is not determined by inputs IN_ACDC and IN_REF, but rather by PRESET_DATA setting the output of inverter 320, which forces the voltage on V_BIAS node. Further, it should be understood that OUT_P is initialized low beginning at 416, as was determined by the low PRESET_DATA during the interval from 408 to 414 when the CLK and CLK_BAR signals enabled inverter 320. (Conversely, it should be understood that if a high voltage PRESET_DATA signal is instead applied to inverter 320 when the high CLK signal and its complement signal, CLK_BAR, is applied to inverter 320, the inverter 320 output will go low, pulling down the connected V_BIAS node of amplifier 110 regardless of amplifier 110 input voltages. In response, amplifier 110 will initially generate a high voltage state on output OUT_P.)

It should be understood from the above that beginning at 416 OUT_P is no longer forced, but rather is subject to the influence of inputs IN_ACDC and IN_REF. Recall that OUT_P was also subject to the influence of inputs IN_ACDC and IN_REF from 406 to 412 in FIG. 4. However, at the beginning of this former region, OUT_P could only be initially high due to NFET 330 pulling the V_BIAS node to ground. In contrast, OUT_P may be either initially high or low beginning at 416, depending on the predetermined level of the PRESET_DATA signal when the CLK and CLK_BAR signals enabled inverter 320. This is advantageous because, as previously stated, the response of initialized OUT_P to the input signals IN_ACDC and IN_REF indicates whether there are significant faults on the tested portion of assembly 100.

In the above described manner, OUT_P may be initialized either high or low, and its response to a combination of input signals signals IN_ACDC and IN_REF that should drive OUT_P either low or high provides a test of the network conductor pair 102. Moreover, the response of OUT_P interacts with hysteretic memory 114. That is, the initialized voltage of amplifier 110 OUT_P is stored by the hysteretic memory as a first logic state. Hysteretic memory 114 tends to hold the first logic state until an opposing voltage exceeding a predetermined threshold is applied to it. So when OUT_P is subject to and responds to the influence of test signal inputs IN_ACDC and IN_REF at 416, if the test-response voltage of OUT_P drives the hysteretic memory to a second logic state, this indicates the network conductor pair 102 has no substantial faults and has passed the test. If, on the other hand, OUT_P fails to drive the hysteretic memory to a second logic state in response to the test signals, this indicates the network conductor pair 102 does have a substantial fault and has not passed the test.

It should be understood that while the embodiment shown herein refers to a test receiver differential amplifier responding to signals on a network conductor pair 102 coupled to inputs of the amplifier, it should be understood that such an amplifier input may receive a signal from any path tending to conduct the signal. According to the testing described above, if conduction of the path exceeds a certain conduction threshold, the hysteretic memory is driven to the second logic state by the test-response voltage on the output node of the amplifier, wherein the test-response voltage arises from a test signal transmitted to amplifier 110 on the path.

Differential Amplifier of an Embodiment of the Present Invention

Figure 5:
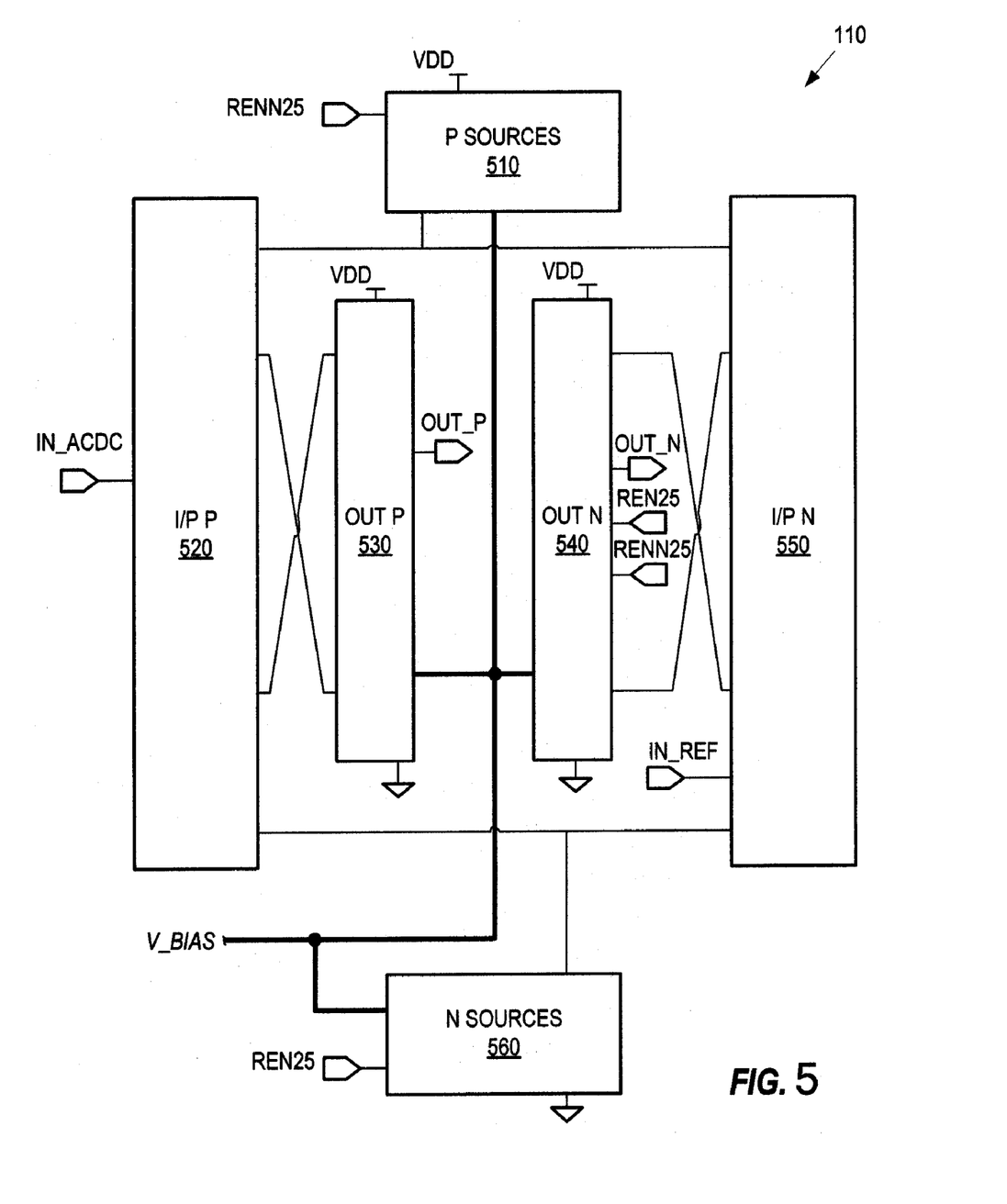
FIG. 5 illustrates a differential amplifier of the test receiver of FIG. 3, according to an embodiment of the present invention.

Referring now to FIG. 5, a block diagram is shown for the differential amplifier 110 of FIG. 3, according to an embodiment of the present invention. Input IN_ACDC of Amplifier 110 is from one conductor of a network conductor pair, as in network pair 102 FIG. 1, and is coupled to input circuitry IN_P 520. IN_P circuitry 520 is coupled, in turn, to input circuitry IN_N 550, and output circuitry OUT_P 530. PFET sources 510 and NFET sources 560 are both also connected to the V_BIAS node and respectively to voltage source V$_{DD}$ and ground. Output circuitry OUT_P 530 is also coupled to voltage source V$_{DD}$, ground, and the V_BIAS node, and responsively generates output OUT_P.

Input IN_REF of amplifier 110 is from a reference voltage and is coupled to circuitry 550. In turn, circuitry 550 is coupled to PFET sources 510, NFET sources 560, circuitry 520, and circuitry 540. Output circuitry OUT_N 540 is also coupled to inputs REN25 and RENN25, voltage source V$_{DD}$, ground, and the V_BIAS node, and responsively generates output OUT_N.

Transistor-Level Structure of the Differential Amplifier

Figure 6:
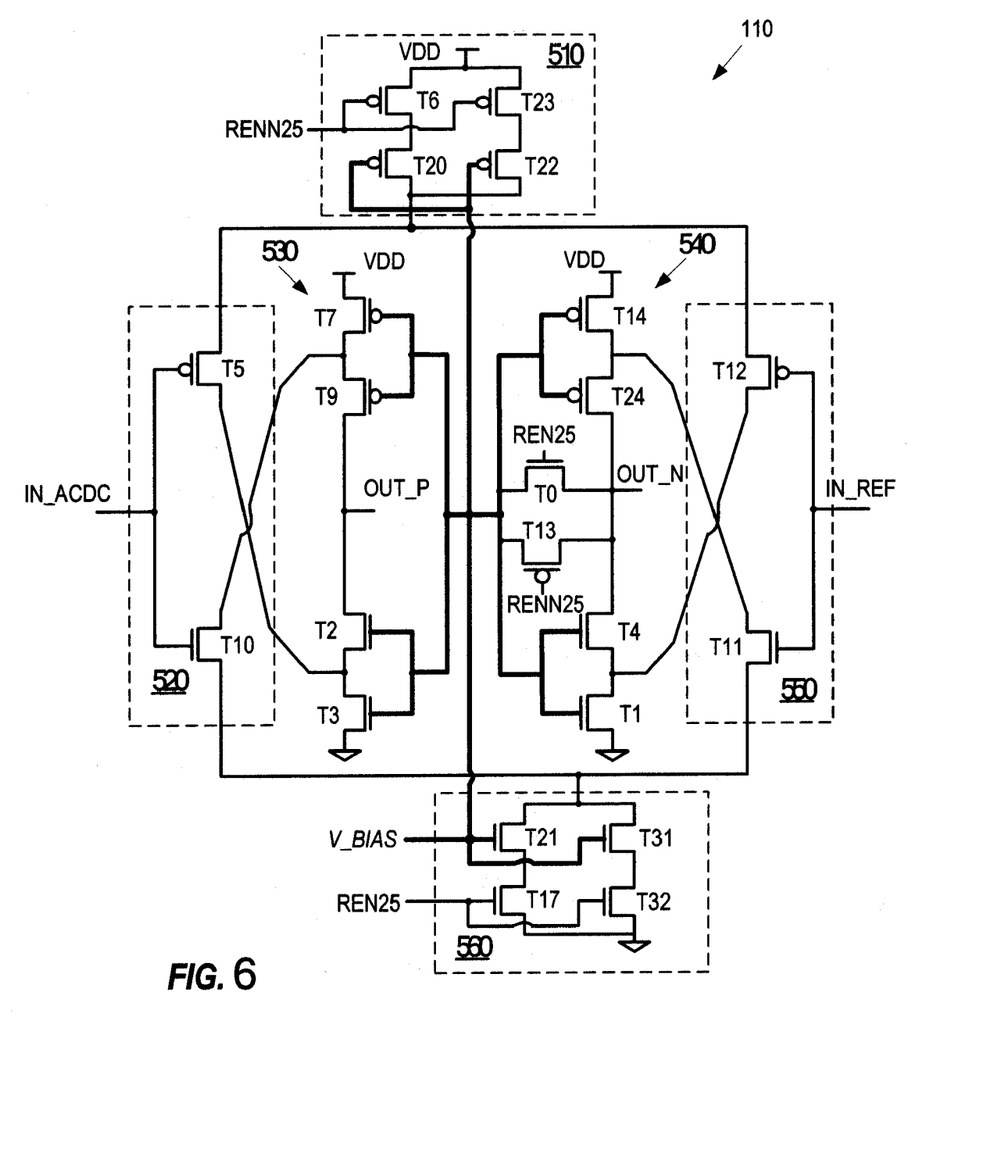
FIG. 6 illustrates further details of the differential amplifier of the test receiver of FIG. 3, according to an embodiment of the present invention.

Referring now to FIG. 6, a transistor-level schematic is shown for the differential amplifier 110 of FIG. 3, according to an embodiment of the present invention. IN_P circuitry 520 includes PFET T5 and NFET T10, with their gates coupled in parallel and receiving input IN_ACDC. One conducting electrode of PFET T5 is coupled to conducting electrodes of NFET's T20 and T22 of PFET sources 510 and a conducting electrode of PFET T12 of IN_N circuitry 550. The other conducting electrode of PFET T5 is coupled to conducting electrodes of NFET's T2 and T3 of OUT_P circuitry 530. One conducting electrode of NFET T10 is coupled to conducting electrodes of NFET's T21 and T31 of NFET sources 560, and to NFET T11 of IN_N circuitry 550. The other conducting electrode of NFET T10 is coupled to conducting electrodes of PFET's T7 and T9 of OUT_P circuitry 530.

PFET SOURCES 510 includes PFET T6 and PFET T20, with conducting electrodes connected in series, and PFET T23 and PFET T22, likewise with conducting electrodes connected in series. The other conducting electrodes of PFET T6 and PFET T23 are coupled to voltage source VDD. The other conducting electrodes of PFET T20 and PFET T22 are coupled to PFET T5 and T12, as stated above. The gates of PFET's T20 and T22 are coupled in parallel and to the V_BIAS node. The gates of PFET's T6 and T23 are coupled in parallel and receive input RENN25 to isolate the IN_P circuitry 520 and circuitry OUT_P 530 by turning off in response to the RENN25 signal.

NFET SOURCES 560, includes NFET T21 and NFET T17, with conducting electrodes connected in series, and NFET T31 and NFET T32, likewise with conducting electrodes connected in series. The other conducting electrodes of NFET T17 and NFET T32 are coupled to ground. The other conducting electrodes of NFET T21 and NFET T31 are coupled to NFET T10 and T11, as stated above and shown in FIG. 6. The gates of NFET's T21 and T31 are coupled in parallel and to the V_BIAS node. The gates of NFET's T17 and T32 are coupled in parallel and receive input RENN25 to isolate the IN_P circuitry 520 and circuitry OUT_P 530 by turning off in response to the RENN25 signal.

IN_N circuitry 550 includes PFET T12 and NFET T11, with their gates coupled in parallel and receiving input IN_REF. One conducting electrode of PFET T12 is coupled to conducting electrodes of NFET's T20 and T22 of PFET sources 510 and a conducting electrode of PFET T5 of circuitry IN_N 520. The other conducting electrode of PFET T12 is coupled to conducting electrodes of NFET's T4 and T1 of OUT_N circuitry 540. One conducting electrode of NFET T11 is coupled to conducting electrodes of NFET's T21 and T31 of NFET sources 560, and to a conducting electrode of NFET T11 of IN_P circuitry 520. The other conducting electrode of NFET T11 is coupled to conducting electrodes of PFET's T14 and T24 of OUT_N circuitry 540.

OUT_P circuitry 530 includes two PFET's T7 and T9 with conducting electrodes coupled in series and with the other one of the T9 conducting electrodes coupled to the output OUT_P and coupled in series to two series connected NFET's T2 and T3. The remaining conducting electrode of T7 is coupled to VDD, while the remaining conducting electrode of T3 is coupled to ground. The gates of all the FET's of OUT_P circuitry 530 are coupled to the V_BIAS node.

OUT_N circuitry 540 includes two PFET's T14 and T24 with conducting electrodes coupled in series and with the other one of the T24 conducting electrodes coupled to the output OUT_N and coupled in series to two series connected NFET's T1 and T4. The remaining conducting electrode of T14 is coupled to VDD, while the remaining conducting electrode of T1 is coupled to ground. The gates of all the FET's of OUT_N circuitry 540 are coupled to the V_BIAS node.

Reference has been made herein to "isolation circuitry" in amplifier 110, for disabling amplifier 110. This isolation circuitry includes PFET's T6 and T23 in PFET source circuitry 510, NFET's T17 and T32 in NFET source circuitry 560, and pass gates NFET T0 and PFET T13 in OUT_N circuitry 540. These FET's may also be referred to herein as "isolation" transistors. Other FET's in amplifier 110, which are ordinarily biased by the voltages on the V_BIAS node or input nodes, may be referred to herein as "biasing" transistors. The FET's of the isolation circuitry are controlled by enable signal REN25 and its complement, RENN25. Specifically, in response to a high RENN25 signal and a low REN25 signal, the isolation circuitry pass gates T0 and T13 isolate amplifier 110 output OUT_N from the V_BIAS node. Likewise, in response to the RENN25 signal PFET's T6 and T23 isolate VDD from input circuitry 520 and 550. Similarly, in response to the REN25 signal, NFET's T17 and T32 isolate VDD from input circuitry 520 and 550.

Further Details of Differential Amplifier Initialization: Low State Example

Referring again to FIG. 4, now in conjunction with FIG. 6, further details of the initialization sequence of differential amplifier 110 are now described, according to an embodiment of the present invention. Prior to 402, to disable operation of amplifier 110, signal RENN25 is asserted, turning on NFET 330 (FIG. 3), which pulls the V_BIAS node to ground, regardless of inputs to the amplifier.

As shown at 402, to enable operation of amplifier 110, signal RENN25 is de-asserted, turning off NFET 330 (FIG. 3). With NFET 330 off, the V_BIAS node voltage may be forced by inverter 320. However, at 402 CLK and CLK_BAR are still fixed at voltage levels that cause inverter 320 to be tri-stated, so V_BIAS is free to float.

Signal REN25 is also asserted at 402. With REN25 asserted and RENN25 deasserted, this turns on NFET T0 and PFET T13, which conductively couples output OUT_N of amplifier 110 to the V_BIAS node. (Although they are turned on, T0 and T13 still have a high impedance in comparison to PFET's T14 and T24 when they are turned on, and in comparison to NFET's T4 and T1 when they are turned on. This has significance as will be explained herein below.) Since RENN25 is de-asserted at 402, this also turns on PFET's T6 and T23, so that PFET's T20 and T22 of PFET source circuitry 510 can conductively couple VDD to input circuitry 520 and 550 at some future time if V_BIAS goes to a low voltage level and thereby turns on T20 and T22. Likewise, since REN25 is asserted, this turns on NFET's T17 and T32, so that PFET's T20 and T22 of NFET source circuitry 560 can conductively couple ground to input circuitry 520 and 550 at some future time if V_BIAS goes to a high voltage level and thereby turns on T21 and T31.

Throughout the sequence shown, input signals IN_ACDC and IN_REF to amplifier 110 are fixed at some predetermined voltage levels, as explained herein above. As also previously explained, even though predetermined voltages are applied at some point in assembly 100 (FIG. 1) in an effort to fix the voltages at the IN_ACDC and IN_REF nodes of amplifier 110, the actual voltage at those input nodes may vary, depending on whether assembly 100 has a fault. In response to the input signals, whatever they may be, PFET's T12 and T5 are at least partly turned off and NFET's T11 and T10 are at least partly turned on, the degree to which depends on the input voltages. The at least partly turned on FET's of input circuitry 520 and 550 feed voltage back from output circuitry 530 to output circuitry 540, and vice versa, through the FET's of output circuitry 530 and 540. The feedback permits the input circuitry 550 and 520 and output circuitry 530 and 540 to interact and adjust until an equilibrium is obtained on the V_BIAS node, at 406, typically at a level around VDD/2. The voltage level of amplifier 110 outputs is not known because it is not known the extent to which the input voltages are effectively conducted on assembly 100 (FIG. 1) to input nodes 302 on amplifier 110 (FIG. 3).

With a low voltage PRESET_DATA signal applied in the illustrated instance, a high CLK signal and its complement signal, CLK_BAR, are applied to inverter 320 at 408. This combination of PRESET_DATA, CLKC and CLK_BAR responsively drives the output of inverter 320, and the connected V_BIAS node, to a high voltage state at 410.

In response to the high voltage on V_BIAS node, NFET's T1-T4 turn fully on and PFET's T7, T9, T14 and T24 turn fully off in output circuitry 530 and 540. (Note that this is in contrast to conventional, prior art operation, in which these and other FET's coupled to the V-BIAS node are merely partially biased.) This pulls OUT_P to ground, at 412, through NFET's T1-T4.

Pass gates T0 and T13 have such a high impedance that even though they are turned on, their small current does not overcome the voltage on V_BIAS forced by the output of inverter 320, so T1-T4 stay on and T7, T9, T14 and T24 stay off at this point. Also, the high voltage on V_BIAS turns on T21 and T31 in NFET source circuitry 560, and REN25 is asserted now, so that T17 and T32 are also on in NFET source circuitry 560, which conductively couples ground to T11 and T10 in input circuitry 550 and 520, which are partly turned on by the input voltage 0.5V. Nevertheless, this ground source does not find a path to VDD through T11 or T10, since the high voltage on V_BIAS has PFET's T7, T9, T14 and T24 turned off.

Next, to begin a test, at 414, CLK and CLK_BAR are returned to low and high states, respectively, as shown, which again tri-states the output of inverter 320 to a high output impedance. Thus, at 416 the V_BIAS node is now once again free to float, so that it returns to an equilibrium of about VDD/2. Although pass gates T0 and T13 of amplifier 110 are on for the test (due to the states of RENN25 and REN25), their impedance is so high that current through them is not sufficient to pull V_BIAS to ground and change the state of amplifier 110 outputs during the short interval of the test, unless voltage on inputs IN_ACDC and IN_REF is sufficient to drive such a change. Hysteretic memory 114 coupled to output OUT_P also tends to hold the state of amplifier 110 unless voltage on inputs IN_ACDC and IN_REF is sufficient to drive output OUT_P to change the state of memory 114.

Alternative Differential Amplifier

Figure 7:
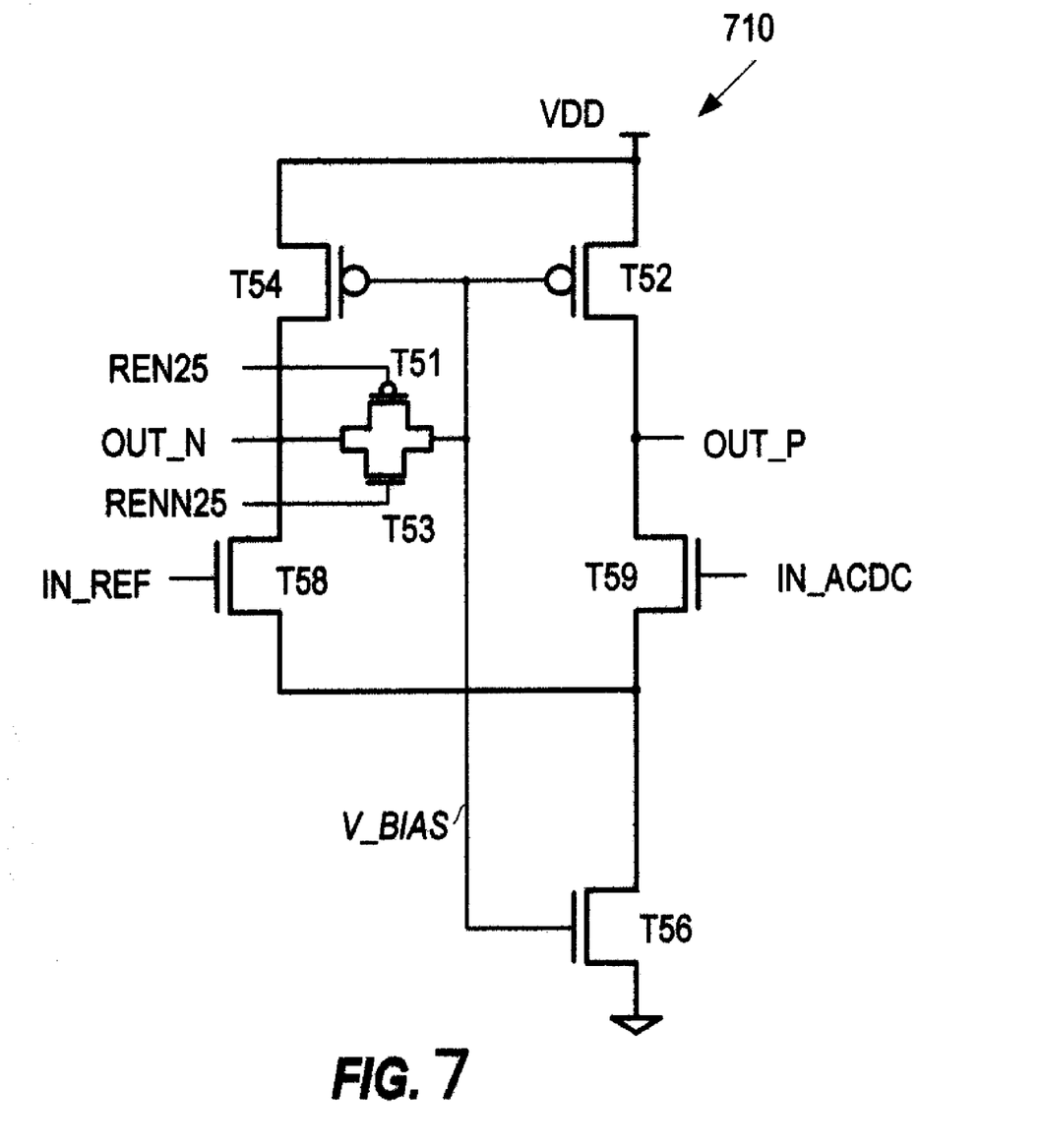
FIG. 7 illustrates another differential amplifier of the test receiver of FIG. 3, according to an embodiment of the present invention.

Referring now to FIG. 7, a transistor-level schematic is shown for a simpler, alternative differential amplifier 710 that may be used in some tests instead of amplifier 110 in FIG. 3, according to an embodiment of the present invention. Amplifier 710 has two PFET/NFET pairs T54 and T58, and T52 and T59, with respective conducting electrodes of the pairs coupled in series. The other conducting electrodes of PFET's T54 and T52 are coupled to VDD. The other conducting electrodes of NFET's T58 and T59 are coupled to ground via NFET T56.

The connected electrodes of T54 and T58 form output OUT_N, while the connected electrodes of T52 and T59 form output OUT_P. The gate of T58 receives input IN_REF, while the gate of T59 receives input IN_ACDC. The gates of PFET's T54 and T52 are coupled to the gate of NFET T56 and form the V_BIAS node, which is coupled to the output of inverter 320 and to one of the conducting electrodes of pulldown FET 330 in FIG. 3, if amplifier 710 is used instead of amplifier 110. (Likewise, the outputs of amplifier 710 are coupled to hysteretic memory 114 in FIG. 3, if amplifier 710 is used instead of amplifier 110.) The output nodes of amplifier 710 are also coupled to the amplifier's V_BIAS node via conducting electrodes of high impedance pass gates PFET T51 and NFET T53, which have their gates coupled to RENN25 and REN25, respectively.

Alternative Differential Amplifier Initialization Process

Just as in the case for amplifier 110, RENN25 is fixed to a low voltage level, and REN25 to a high voltage level to enable initialization and test using amplifier 710. To initialize amplifier 710 to a high state on outputs OUT_N and OUT_P, inverter 320 (FIG. 3) drives V_BIAS to a low state responsive to CLK_, CLK_BAR and PRESET_DA, just as shown in FIG. 4. With a low V_BIAS, this turns on PFET's T54 and T52 and turns off NFET's T58, T59 and T56, pulling the output nodes OUT_N and OUT_P up to near VDD. Amplifier 710 is not suited for initialization to a low output in the configuration shown in FIG. 3.

Other Variations and General Remarks

The description of the present embodiment has been presented for purposes of illustration, but is not intended to be exhaustive or to limit the invention to the form disclosed. Many modifications and variations will be apparent to those of ordinary skill in the art. For example, in the instance described herein above, the PRESET_DATA signal drove the output of inverter 320 (and the connected V_BIAS node) to a high-voltage state for initialization of amplifier 110, i.e., before beginning a particular test that required this state. It should also be understood that if the test had required the opposite state, so that inverter 320 had instead driven V_BIAS low, this would have worked equally well to initialize amplifier 110 to output a high voltage on its outputs OUT_N and OUT_P. That is, in response to a low voltage on V_BIAS node, NFET's T1-T4 would turn off and PFET's T7, T9, T14 and T24 would turn on in output circuitry 530 and 540. This would pull OUT_N and OUT_P to VDD through PFET's T7, T9, T14 and T24, but because pass gates T0 and T13 have such a high impedance, even though they are turned on at this time, the current through T0 and T13, i.e., from the low voltage on V_BIAS to VDD on T14, would not pull up the voltage on V_BIAS. Thus T1-T4 would stay off and T7, T9, T14 and T24 stay on. Also, the low voltage on V_BIAS would turn on PFET's T20 and T22 in source circuitry 510. Since in this mode RENN25 is de-asserted for this initialization mode, T6 and T23 are on in PFET source circuitry 510, which conductively couples VDD to T12 and T5 in input circuitry 550 and 520, which are partly turned on by the input voltage 0.5V. Nevertheless, this VDD source would not find a path to ground through T12 or T5, since the low voltage on V_BIAS would have NFET's It should be appreciated from the above description that by inverter 320 driving V_BIAS high, amplifier 110 is elegantly initialized to output a voltage state on its outputs OUT_N and OUT_P with only a small amount of preset circuitry. It should be understood that circuitry shown herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

What is claimed is:

1. A method of testing an electronic assembly having an amplifier on an integrated circuit chip of the assembly, the method comprising the steps of:
    a) applying a predetermined test voltage to a path of the electronic assembly, wherein circuitry of the amplifier is operable to produce a voltage on an output node of the amplifier and a self-bias voltage on a self-bias node of the amplifier responsive to voltages applied to differential input nodes of the amplifier, and wherein the applied test voltage is for testing conduction of the path, including conduction to one of the differential input nodes; and
    b) forcing an initializing voltage on the self-bias node by preset circuitry, wherein if the amplifier tends to produce an equilibrium voltage on the self-bias node responsive to the applied test voltage, the initializing voltage overrides the equilibrium voltage, so that the amplifier produces an initial voltage on the output node in response to the initializing voltage on the self-bias node and independently of the applied test voltage.

2. The method of claim 1, wherein the preset circuitry includes a tri-state inverter having an output coupled to the self-bias node and a pulldown transistor coupled between the self-bias node and a ground source, and wherein the method includes:
    turning off the pulldown transistor in an amplifier enabling mode, so that the self-bias node is not grounded;
    switching the inverter to an initializing mode for step b), wherein in the initializing mode the tri-state inverter produces the initializing voltage on an output of the inverter in response to a data signal applied to an input of the tri-state inverter;
    switching the inverter to a non-initializing mode after step b), wherein in the non-initializing mode the inverter output has a high output impedance, so that after the amplifier produces the initial voltage on the output node in response to the initializing voltage on the self-bias node, the circuitry of the amplifier produces a test-response voltage on the output node of the amplifier responsive to the test voltage applied to one of the amplifier input nodes via the path.

3. The method of claim 2, wherein a hysteretic memory is coupled to the output node, and step b) includes storing the initial voltage of the amplifier output node by the hysteretic memory as a first logic state, and wherein if conduction of the path exceeds a certain conduction threshold, the test-response voltage on the output node of the amplifier drives the hysteretic memory to a second logic state.

4. The method of claim 1, wherein the preset circuitry includes a pulldown transistor coupled between the self-bias node and a ground source, and wherein the method includes:
    turning on the pulldown transistor responsive to an amplifier disabling state of an amplifier control signal, so that the self-bias node is grounded; and
    turning off the pulldown transistor responsive to an amplifier enabling state of the amplifier control signal, so that the self-bias node is not grounded.

5. The method of claim 1, wherein the preset circuitry includes a tri-state inverter having an output coupled to the self-bias node and in a non-initializing mode the inverter output has a high output impedance, and the method includes:
    applying a data signal to a data input of the tri-state inverter; and
    switching the inverter to an initializing mode for step b) responsive to an initializing state of an inverter control signal, wherein in the initializing mode the tri-state inverter produces the initializing voltage on an output of the inverter in response to the data signal.

6. The method of claim 1, wherein the amplifier includes source circuitry isolation transistors coupled to respective voltage and ground sources and source circuitry bias transistors coupled to the respective source circuitry isolation transistors, and the method includes:
    receiving an amplifier control signal, wherein first and second input circuitry of the amplifier have biasing transistors with conducting electrodes coupled to the voltage and ground sources through source circuitry isolation and biasing transistors and with gates coupled to the respective amplifier input nodes;
    turning on the source circuitry isolation transistors in response to an enabling state of the amplifier control signal, so that the source circuitry bias transistors are conductively coupled to their respective voltage and ground sources for an enabled mode of operation of the amplifier; and
    turning off the source circuitry isolation transistors in response to an disabling state of the amplifier control signal, so that the source circuitry bias transistors are isolated from their respective voltage and ground sources for an disabled mode of operation of the amplifier.

7. The method of claim 1, wherein the amplifier has voltage and ground sources, and first output circuitry of the amplifier has biasing transistors with gates coupled to the self-bias node and with conducting electrodes coupling the output node to the voltage and ground sources, and wherein producing the initial voltage on the output node in response to the initializing voltage on the self-bias node includes:
    switching the first output circuitry biasing transistors in response to the forced overriding of the self-bias node voltage to conductively couple the output node to only one or the other of the voltage and ground sources.

8. The method of claim 7, wherein second output circuitry of the amplifier has biasing transistors with gates coupled to the self-bias node and with conducting electrodes coupling a second output node to the voltage and ground sources, the method including:
switching the second output circuitry biasing transistors in response to the forced overriding of the self-bias node voltage to conductively couple the second output node to only one or the other of the voltage and ground sources, so that the initial voltage of the first output node is also produced on the second output node.

9. The method of claim 8, wherein for the amplifier enabling mode the method includes:
conductively coupling the second output node to the self-bias node via pass gate transistors, each such pass gate transistor having a conducting impedance at least ten times larger than a conducting impedance of each of the second output circuitry biasing transistors.

10. An electronic assembly including:
an amplifier on an integrated circuit chip of the assembly, the amplifier having differential input nodes;
a path for conducting a voltage to one of the input nodes of the amplifier, wherein the amplifier includes a self-bias node, an output node and circuitry operable to produce an output voltage on the output node and a self-bias voltage on the self-bias node responsive to voltages applied to the differential input nodes; and
preset circuitry operable to force an initializing voltage on the self-bias node, so that if the amplifier tends to produce an equilibrium voltage on the self-bias node responsive to a test voltage applied to the path of the electronic assembly, the initializing voltage overrides the equilibrium voltage, wherein the amplifier produces an initial voltage on the output node in response to the initializing voltage on the self-bias node and independently of the test voltage applied to the path.

11. The assembly of claim 10, wherein the preset circuitry includes:
a tri-state inverter having an output coupled to the self-bias node; and
a pulldown transistor coupled between the self-bias node and a ground source, the preset circuitry being operable to i) turn off the pulldown transistor in an amplifier enabling mode, so that the self-bias node is not grounded, and ii) switch the inverter to an initializing mode, wherein in the initializing mode the tri-state inverter is operable to produce the initializing voltage on an output of the inverter responsive to a data signal applied to an input of the tri-state inverter, the preset circuitry being further operable to switch the inverter to a non-initializing mode after the initializing voltage is produced on the inverter output, wherein in the non-initializing mode the inverter output has a high output impedance, so that after the amplifier produces the initial voltage on the output node in response to the initializing voltage on the self-bias node, the circuitry of the amplifier produces a test-response voltage on the output node of the amplifier responsive to the test voltage applied to one of the amplifier input nodes via the path.

12. The assembly of claim 11, wherein the assembly includes a hysteretic memory coupled to the output node and operable to store the initial voltage of the amplifier output node as a first logic state, and wherein if conduction of the path exceeds a certain conduction threshold the test-response voltage on the output node of the amplifier drives the hysteretic memory to a second logic state.

13. The assembly of claim 10, including:
a mission receiver on the integrated circuit chip, wherein the path for conducting a voltage to one of the input nodes of the amplifier is also for conducting the voltage to an input node of the mission receiver.

14. The assembly of claim 10, wherein the preset circuitry includes a pulldown transistor having conducting electrodes coupled between the self-bias node and a ground source and a gate for receiving an amplifier control signal, the pulldown transistor being operable to turn on, and thereby isolate the self-bias node from the ground source, in response to a disabling state of the amplifier control signal and turn off, and thereby conductively couple the self-bias node to the ground source, in response to an enabling state of the amplifier control signal.

15. The assembly of claim 10, wherein the preset circuitry includes a tri-state inverter operable to receive an inverter control signal and a data signal and having an output coupled to the self-bias node, the inverter output being operable to switch to a high output impedance responsive to a non-initializing state of the inverter control signal and to produce the initializing voltage on an output of the inverter responsive to the data signal and an initializing state of the inverter control signal.

16. The apparatus of claim 10, wherein the amplifier is operable to receive an amplifier control signal and the amplifier includes:
source circuitry, including:
source circuitry isolation transistors, coupled, respectively, to voltage and ground sources; and
source circuitry bias transistors, coupled, respectively, to the source circuitry isolation transistors; and
first and second input circuitry, wherein the first and second input circuitry have biasing transistors with conducting electrodes coupled to the voltage and ground sources through the source circuitry isolation and biasing transistors and with gates coupled to the respective amplifier input nodes, wherein the source circuitry isolation transistors are operable to turn on in response to an enabling state of the amplifier control signal, so that the source circuitry bias transistors are conductively coupled to their respective voltage and ground sources for an enabled mode of operation for the amplifier, and the source circuitry isolation transistors are operable to turn off in response to an disabling state of the amplifier control signal, so that the source circuitry bias transistors are isolated from their respective voltage and ground sources for an disabled mode of operation for the amplifier.

17. The assembly of claim 10, wherein the amplifier has voltage and ground sources, and first output circuitry of the amplifier has biasing transistors with gates coupled to the self-bias node and with conducting electrodes coupling the output node to the voltage and ground sources, and wherein producing the initial voltage on the output node in response to the initializing voltage on the self-bias node includes switching the first output circuitry biasing transistors in response to the forced overriding of the self-bias node voltage to conductively couple the output node to only one or the other of the voltage and ground sources.

18. The assembly of claim 17, wherein second output circuitry of the amplifier has biasing transistors with gates coupled to the self-bias node and with conducting electrodes coupling a second output node to the voltage and ground sources, and wherein the second output circuitry biasing transistors switch to conductively couple the second output node to only one or the other of the voltage and ground sources in response to the forced overriding of the self-bias node voltage, so that the initial voltage of the first output node is also produced on the second output node.

19. The assembly of claim 18, wherein the second output node conductively couples to the self-bias node via pass gate transistors responsive to an enabling state of the amplifier control signal, each such pass gate transistor having a conducting impedance at least ten times larger than a conducting impedance of each of the second output circuitry biasing transistors.

20. An electronic assembly including:
an amplifier on an integrated circuit chip of the assembly, the amplifier having differential input nodes;
a path for conducting a voltage to one of the input nodes of the amplifier, wherein the amplifier includes a self-bias node, an output node and circuitry operable to produce an output voltage on the output node and a self-bias voltage on the self-bias node responsive to voltages applied to the differential input nodes; and
preset circuitry operable to force an initializing voltage on the self-bias node, so that if the amplifier tends to produce an equilibrium voltage on the self-bias node responsive to a test voltage applied to the path of the electronic assembly, the initializing voltage overrides the equilibrium voltage, wherein the amplifier produces an initial voltage on the output node in response to the initializing voltage on the self-bias node and independently of the test voltage applied to the path;
a mission receiver on the integrated circuit chip, wherein the path for conducting a voltage to one of the input nodes of the amplifier is also for conducting the voltage to an input node of the mission receiver, wherein the amplifier is operable to receive an amplifier control signal, and the amplifier includes:

source circuitry, including i) source circuitry isolation transistors coupled to respective voltage and ground sources and ii) source circuitry bias transistors respectively coupled to the source circuitry isolation transistors; and
first and second input circuitry having biasing transistors, wherein the biasing transistors have conducting electrodes coupled to the voltage and ground sources through the source circuitry isolation and biasing transistors and gates coupled to the respective amplifier input nodes, wherein the source circuitry isolation transistors are operable to turn on in response to an enabling state of the amplifier control signal, so that the source circuitry bias transistors are conductively coupled to their respective voltage and ground sources for an enabled mode of operation for the amplifier, and the source circuitry isolation transistors are operable to turn off in response to an disabling state of the amplifier control signal, so that the source circuitry bias transistors are isolated from their respective voltage and ground sources for an disabled mode of operation for the amplifier; and
first output circuitry of the amplifier having biasing transistors with gates coupled to the self-bias node and with conducting electrodes coupling the output node to the voltage and ground sources, and wherein producing the initial voltage on the output node in response to the initializing voltage on the self-bias node includes switching the first output circuitry biasing transistors in response to the forced overriding of the self-bias node voltage to conductively couple the output node to only one or the other of the voltage and ground sources.

* * * * *